United States Patent
Côté et al.

(10) Patent No.: US 6,725,435 B2
(45) Date of Patent: Apr. 20, 2004

(54) METHOD AND PROGRAM PRODUCT FOR COMPLETING A CIRCUIT DESIGN HAVING EMBEDDED TEST STRUCTURES

(75) Inventors: Jean-François Côté, Chelsea (CA); Paul Price, Stoughton, MA (US)

(73) Assignee: LogicVision, Inc., San Jose (CA)

( * ) Notice: Subject to any disclaimer, the term of this patent is extended or adjusted under 35 U.S.C. 154(b) by 0 days.

(21) Appl. No.: 10/323,815

(22) Filed: Dec. 20, 2002

(65) Prior Publication Data

US 2003/0145297 A1 Jul. 31, 2003

Related U.S. Application Data

(60) Provisional application No. 60/354,016, filed on Feb. 5, 2002, provisional application No. 60/354,015, filed on Feb. 5, 2002, and provisional application No. 60/350,979, filed on Jan. 25, 2002.

(51) Int. Cl.$^7$ .............................................. G06F 17/50
(52) U.S. Cl. ..................................... 716/5; 4/6
(58) Field of Search ........................ 716/6, 4, 5, 14, 716/17

(56) References Cited

U.S. PATENT DOCUMENTS

| | | |
|---|---|---|
| 5,535,223 A | 7/1996 | Horstmann et al. |
| 5,675,545 A | 10/1997 | Madhavan et al. |
| 5,812,416 A | 9/1998 | Gupte et al. |
| 5,903,475 A | 5/1999 | Gupte et al. |
| 5,974,241 A | 10/1999 | Fusco |
| 6,086,621 A | 7/2000 | Ginetti et al. |
| 6,182,020 B1 | 1/2001 | Fairbanks |
| 6,304,837 B1 | 10/2001 | Geiger et al. |
| 6,336,206 B1 | 1/2002 | Lockyear |
| 6,363,509 B1 | 3/2002 | Parulkar et al. |
| 6,425,113 B1 | 7/2002 | Anderson et al. |
| 6,564,365 B1 * | 5/2003 | Argyres ........................ 716/11 |

* cited by examiner

*Primary Examiner*—Leigh M. Garbowski
*Assistant Examiner*—Andrea Liu
(74) *Attorney, Agent, or Firm*—Eugene E. Proulx

(57) ABSTRACT

A sign-off method for use in verifying of embedded test structures in a circuit design extracts a description of all embedded test structures from a circuit description to create a test connection map file, and verifies the connections of the test structures to circuit pins or nets, creates verification configuration files for use, in performing a sign-off verification of the circuit, for a circuit containing logic test structures, verifies that each logic test structure complies with logic test design rules and creates logic test vectors and a reference signature, performs a formal verification and a static timing analysis of the circuit, generates a sign-off simulation test bench for each test structure using the verification configuration files and the test connection map file, executes the test benches to simulate all test structures in the circuit; and creates manufacturing test patterns.

23 Claims, 3 Drawing Sheets

METHOD AND PROGRAM PRODUCT FOR COMPLETING A CIRCUIT DESIGN HAVING EMBEDDED TEST STRUCTURES

CROSS REFERENCE TO RELATED APPLICATION

This application claims the benefit of U.S. Provisional Application Ser. No. 60/354,015 filed Feb. 5, 2002.

This application is related to U.S. Provisional Application Ser. No. 60/350,979 filed Jan. 25, 2002 for "Method and Program Product for Creating and Maintaining a Self-Contained Design Environment".

This application is related to U.S. Provisional Application Ser. No. 60/354,016 filed Feb. 5, 2002 for "Method and Program Product for Verification of a Circuit Design".

BACKGROUND OF THE INVENTION

1. Field of the Invention

The present invention relates generally to integrated circuit design and, more specifically, to a method of completing the design of integrated circuits having embedded test structures.

2. Description of Related Art

As the design of integrated circuits continues to become more complex, it is becoming increasingly necessary to embed specialized test structures into circuit designs and develop specialized verification methodology. The addition of embedded test to a circuit is complex, particularly for large circuits. The circuit must be analyzed to identify sub-blocks which must be modified to receive embedded test features. The modified sub-blocks must be integrated into its parent block which must then be modified to access the test structures added to the sub-block. Some parent blocks may contain many sub-blocks. The test ready parent blocks are then inserted into a circuit top-level block which must then be prepared to access the test structures embedded in the blocks and sub-blocks. The test structures may include a number of test controllers of various types including, for example, logic test controllers, including one for each block in the circuit, phase lock loop controllers, memory test controllers and others.

After the circuit functional design has been completed and all test structures have been integrated into the circuit, the circuit must be prepared for sign-off to manufacturing. There is a need for a circuit sign-off flow or method for use with circuits in which embedded test structures have been integrated into a circuit design to ensure that the completed circuit can be properly verified as quickly, efficiently and accurately as possible.

SUMMARY OF THE INVENTION

The present seeks to provide a sign-off flow or method for use with circuits in which embedded test structures have been integrated to ensure that the completed circuit can be properly verified as quickly, efficiently and accurately as possible.

One aspect of the present invention is generally defined as a circuit sign-off method for use in verifying a circuit design having circuit modules with embedded test circuitry, comprising, for each circuit module, checking connectivity of embedded test circuitry; creating a verification configuration file; for a circuit module having logic test circuitry, checking the circuit module against scan design rules; and creating associated logic test vectors and signature; performing a timing analysis of the circuit module; creating a hand-off database containing files associated with each test structure embedded in the circuit module; creating circuit module top-level test benches for validating each mode of operation of each embedded test circuitry using parameters contained in the configuration file; simulating the embedded test circuitry by executing the test benches on a simulator; and creating manufacturing test patterns after all verification steps have been successfully completed and following optimization and layout of the circuit.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

The present invention is particularly concerned with a sign-off flow or method for use in completing, prior to manufacture, the design of a circuit in which test structures have been embedded. The sign-off flow may be better appreciated from the following brief description of a circuit embedded test integration design flow.

Figure 1:
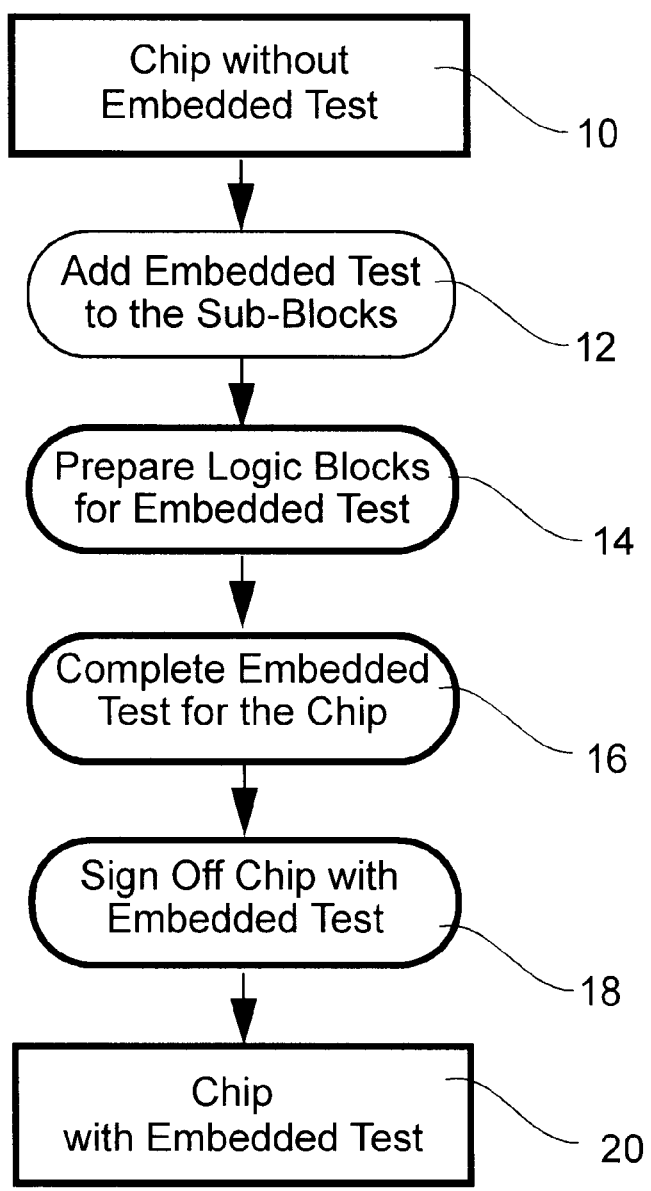
FIG. 1 is a block diagrammatic view of a circuit design flow.

FIG. 1 diagrammatically illustrates an embedded test design flow in which embedded test structures or circuitry are added to a circuit design 10. The embedded test design flow includes four basic phases including a sub-block flow 12, a prepare logic flow 14, a top-level flow 16 and a sign-off flow 18 which results in a circuit design with embedded test 20.

Sub-Block Flow

Figure 2:
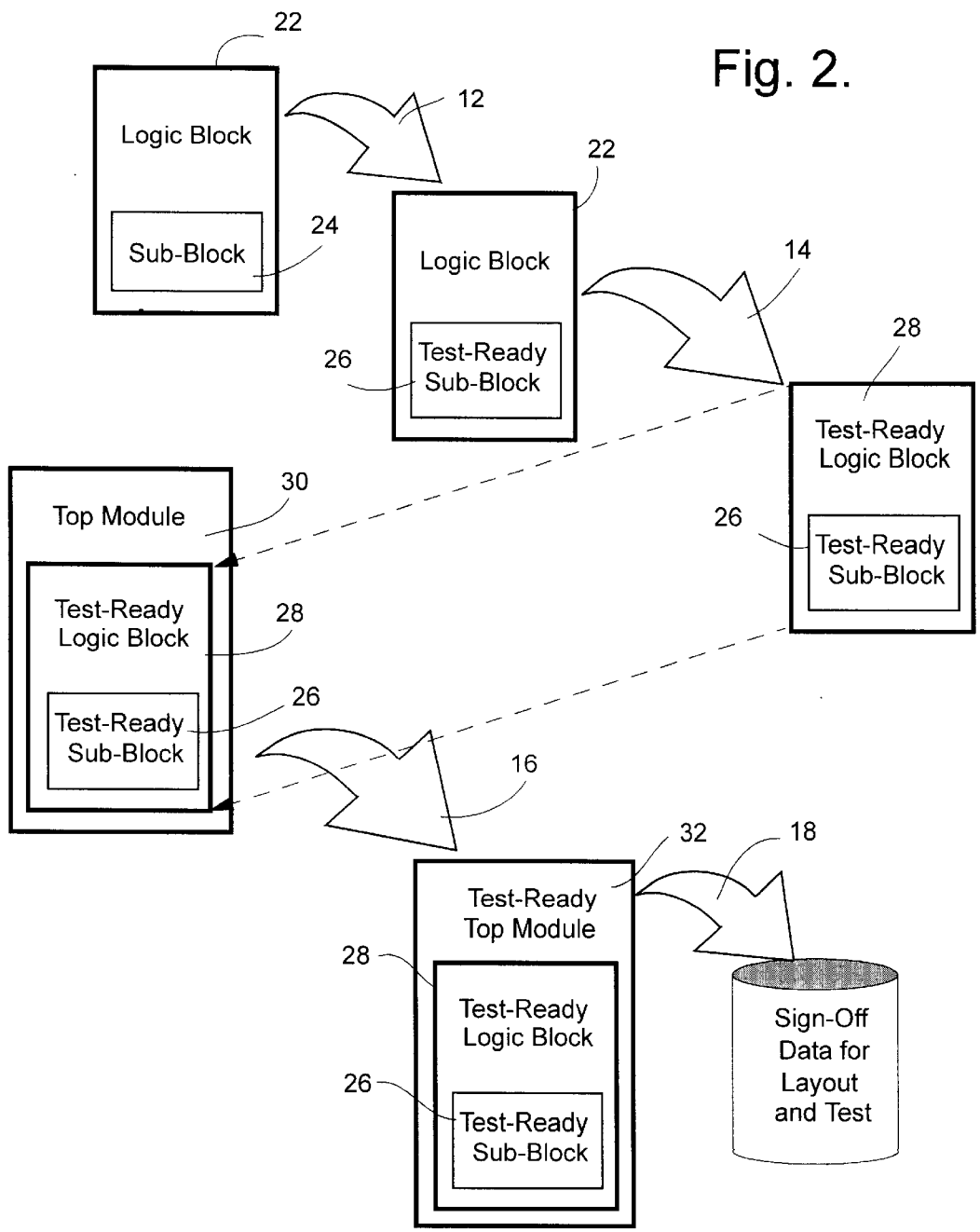
FIG. 2 is a more detailed diagrammatic view of a circuit design flow incorporating a sign-off flow according to an embodiment of the present invention.

Sub-block flow 12 adds embedded test to circuit sub-blocks. FIG. 2 illustrates a module or core 22 having one sub-block or sub-module 24. Module 22 may include many sub-blocks which require embedded test, in which case the sub-block flow is performed on each sub-block. In general, sub-blocks are components such as memories, phase-locked loops (PLLs), legacy cores and the like. In the sub-block flow, embedded test includes structures such as Built-In Self-Test (BIST) controllers for sub-blocks such as memories and phase-locked loops (PLLs), while, for sub-blocks such as legacy cores, embedded test includes providing access and isolation to the core. The details of embedded test vary depending on the type of sub-block. A description of the embedded test structures of the sub-blocks is generated and integrated into the description of the sub-block, resulting in a description of a test ready sub-block 26. An RTL functional design of the sub-block and its integrated embedded test structures, may then be synthesized.

Prepare Logic Flow

Prepare logic flow 14 prepares the top-level of module 22 for embedded test. More specifically, the embedded test associated with test ready sub-blocks 26 is made accessible at the top level of module 22, logic is rule-checked and made scannable, and fault coverage is calculated. Embedded test may include scan test or logic BIST structures. This phase results in a test-ready module 28 having one or more test ready sub-blocks 26 with all of the test structures embedded in the sub-blocks being accessible from the ports of test ready module 28. A circuit may be comprised of several modules 22 which require preparation in this manner.

Top-Level Flow

Top-level flow 16 completes integration of embedded test structures into a circuit. In this phase, embedded test structures are added to top-level module 30 of the circuit. The embedded test structures in this phase may include structures such as a test-access port (TAP) (not shown), optional structures such as boundary scan, logic test controllers, and other embedded test capabilities well known in the art. This phase results in a test ready top module 32 having one or more test ready modules 28 having, in turn, one or more test ready sub-blocks 26. Circuit 10 may initially be in the form of several sub-circuits which are processed individually, resulting in a plurality of test ready sub-circuits 20. Each of the above flows includes various forms of analyses and verification procedures which are performed to ensure that the embedded test structures are individually functional and operable according to embedded test design. However, prior to manufacture, it is necessary re-verify all test structures within the context of a completed, test ready circuit. This is the purpose of embedded test sign-off flow 18.

Sign-Off Flow

Sign-Off Flow 18 creates and verifies a final circuit description, test vectors and test patterns for signing-off embedded test structures of the circuit. In this phase, a concatenated, hierarchical circuit description and the final test vectors and test patterns are created for hand-off to manufacturing, a sign-off verification of the embedded test in this description is performed and a hand-off database is created.

In each of the four phases, various software tools perform various tasks, including generating embedded test structures and access mechanisms, integrating embedded test structures into the design, analyzing a design with or without embedded test structures, and verifying a design that contains embedded test using simulating test benches.

Sign-Off Flow

The primary objectives of the sign-off flow are to generate the final test vectors for the chip design, to verify the test vectors by means of simulation, and format the test vectors into the required format for hand-off to manufacturing test. Additionally, a hand-off database is generated for hand-off of the chip to layout or manufacturing or to hand-off a core with embedded test to an IC vendor.

The sign-off flow is intended to be executed multiple times in the process of finishing a chip or core containing embedded test. The flow is usually executed the first time prior to tape-out for an early layout of a non-optimized design. When early layout timing data is returned, and once a design netlist has been optimized based on the timing data, a subset of the sign-off flow is repeated to re-verify and sign-off the final netlist to final layout. Once final layout timing is returned, the same subset of the sign-off flow is repeated again to re-verify and sign-off the final netlist to tape-out. Accordingly, it is desirable to provide a method to automate this phase of the process.

Figure 3:
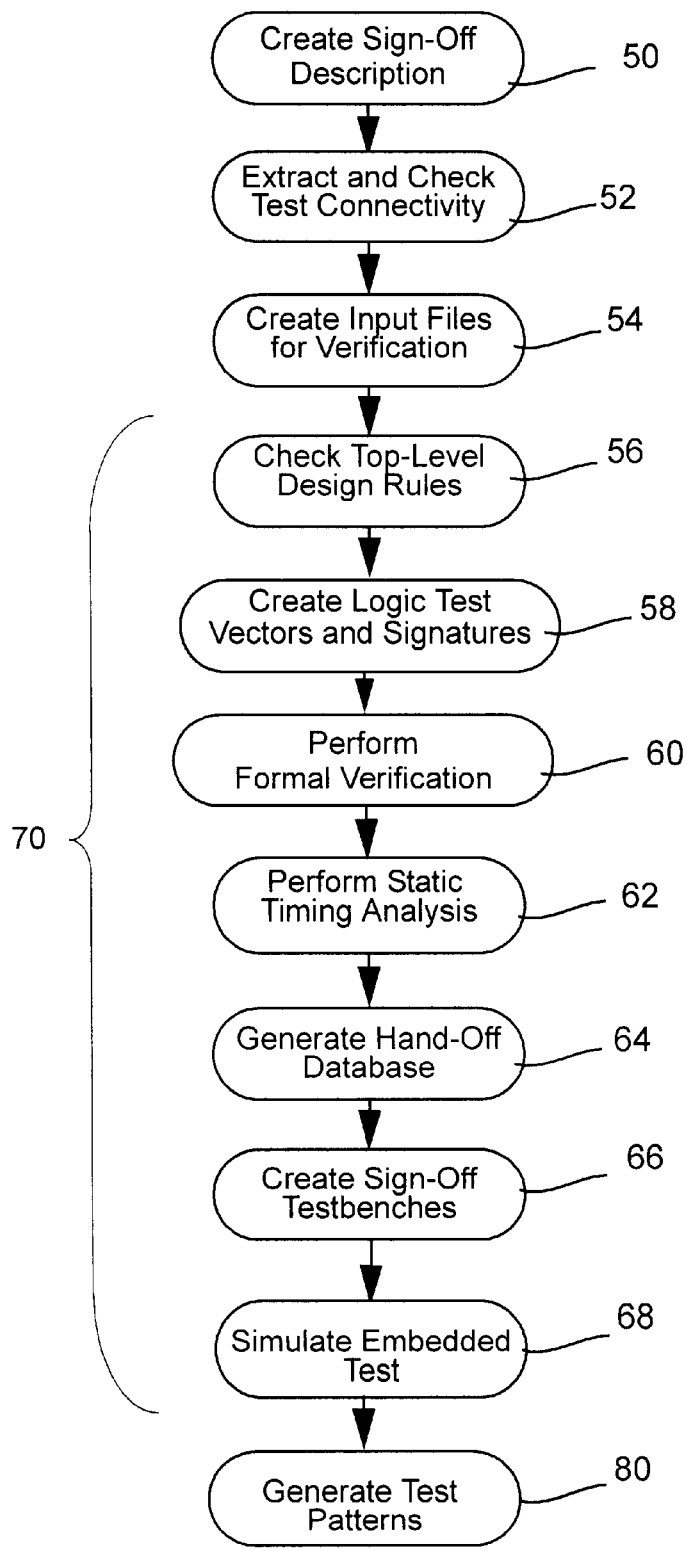
FIG. 3 is a detailed diagrammatic view of a circuit sign-off flow according to an embodiment of the present invention.

An embodiment of the sign-off flow will now be described in greater detail with reference to FIG. 3.

Create Sign-Off Circuit Description

The first step 50 in the sign-off flow comprises concatenating into a top-level description file, all associated test ready circuit description files to produce a final circuit description file. This step is performed by a software tool which locates all related test ready circuit description files and integrates them into a single file. Providing a single file makes it easier for handing-off the circuit.

This step is only performed the first time that the sign-off flow is performed, usually in a pre-optimization pass of the flow. For subsequent passes of the sign-off flow, a post-optimized or post-layout version of the most up-to-date version of the concatenated circuit file is processed.

Extract and Check Test Connectivity

The second step 52 of the sign-off flow comprises extracting from the final circuit description file, a description of the embedded test architecture in the circuit, verifying the correctness of connections of embedded test structures in the final circuit description file and creating a test connection map file. This step is also performed by a software tool. Typically, this step need only be performed the first time the flow is performed. More specifically, step 52 comprises the following operations:

(a) Extracting a description of the embedded test architecture from the final circuit description file and checking the connections of embedded test structures for the entire design. The test architecture comprises test controllers and any associated circuitry. The connections include connections to test controllers, terminals of the test-ready modules and ports of the top-level design module, ports of the top-level design module and a Test Access Port (TAP), if a TAP is used in the design, ports of the top-level design module and boundary scan cells, if any, and/or peripheral pads.

(b) Generating a test connection map file for use in a top-level verification process described below. The test connection map file describes to an embedded test verification tool, the connections between each embedded test controller and ports of the top module. A companion provisional application No. 60/354,016 filed on Feb. 5, 2002, entitled "Method and Program Product for Verification of a Circuit Design", incorporated herein by reference, describes and illustrates the verification tool.

(c) Generating a log file which contains a summary of selected runtime options, clock information, and any errors that were detected during execution of the step.

If any errors are reported in the log file, the circuit description must be corrected and the flow re-started. Step 52 need only be performed the first time that the sign-off flow is performed, usually in the pre-optimization pass, after the concatenated circuit description file in Step 50 has been created.

Create Verification Configuration File

The third step 54 of the sign-off flow comprises creating a verification configuration file for use in performing a sign-off verification at the top-level of the circuit. Typically, this step need not be repeated in subsequent executions of the sign-off flow. The configuration file is created by running the sign-off verification tool with appropriate runtime options. More specifically, the following tasks are performed to create the required input files:

(a) The user invokes the verification tool to create a startup template file using an appropriate command. In response, the verification tool extracts from a test connection map file, clock pin names and specifies a corresponding default clock period and uses this information in a subsequent pass to create customized configuration files for sign-off verification.

(b) The user edits the startup template file by replacing the default clock periods associated with all extracted clock pins with desired clock period values, ensures that no clock pins are missing and specifies values for clock pins and frequencies used by Test controllers in the chip design. The startup template file contains an "Clock-Periods" wrapper in which the user enters the required information. The verification tool uses the information to determine the speed of each controller.

(c) The user invokes the verification tool a second time using an appropriate command to create the configuration files described below for sign-off verification. In response, the verification tool compiles a complete list of embedded test controllers from the test connection map file, and, using the clock periods from the edited startup file, generates two configuration files, namely a SignOff configuration file and a Manufacturing configuration file. These configuration files contain parameters for a sequence of steps that must be simulated to fully verify the proper operation of all embedded test structures in the chip. The Manufacturing configuration file is not generated when only cores are being signed off.

The configuration files need not be edited at this point. However, if any modifications are made to the design, such as adding or removing embedded test structures, the startup file must be re-created and then the configuration files must be re-created. In general, the user need not edit the SignOff and Manufacturing configuration files. However, the files may be edited to change the default scenarios for verification of the embedded test capabilities or manufacturing test. The generated configuration files contain the following information for each embedded test structure integrated in the chip design:

frequency of operation of the clock driving the embedded test;

fault coverage targets for logic test;

configuration and number of test patterns to use;

test operations to perform and their sequencing;

test mode (logic BIST, scan, or diagnostic) for logic test;

parameters to measure (for example, in mixed-signal BIST);

test patterns in WGL, SVF, and Hand-off Database.

The information differs between the SignOff and Manufacturing configuration files. The properties specified in the SignOff configuration file specify requirements for verification, whereas those in the Manufacturing configuration file specify requirements for go/no-go testing.

This step is only performed the first time that the sign-off flow is performed, usually pre-optimization, after the concatenated final circuit description file in step 50 has been created and embedded test connectivity has extracted and checked test in Step 52.

Check Top-Level Design Rules

The fourth step 56 of the sign-off flow is performed only if the circuit contains logic test structures. The step is performed whenever the sign-off flow is performed. For a circuit containing a logic test structure having a logic Test controller, the sign-off flow further includes:

(a) performing a top-level design rules check or analysis to verify that the top-level embedded test structures comply with predetermined design rules for scan test and logic BIST. A rule analysis tool is used to re-check (the same analysis tool which was used when the test structure was initially created) to analyze the top-level embedded test structures to determine whether they still comply with the design rules for scan test and logic BIST, including the Prepare Logic Flow rules and TAP connection rules.

In general, the rule analysis tool that analyzes the behavior of the circuit in the concatenated circuit description, extracts this information, and stores the information in files that are used by the verification tool to generate verification test benches and test patterns. The analysis tool is first run in the sign-off flow to rule check the original concatenated circuit description created in step 50. Subsequently, the tool is run to rule check a final pre-layout netlist and, finally, a pre-tapeout circuit description. Re-running the analysis tool accounts for the effects of engineering change orders (ECOs) and scan-chain reordering that may happen during layout and physical optimization.

If cores with embedded logic test are being signed-off, the analysis tool must also be run to check a simplified or shell model of the periphery logic and the core test collar in external mode, as described and claimed in Applicant's U.S. patent application Ser. No. 09/626,877 filed on Jul. 27, 2000 for "Hierarchical Design and Test Method and System Embodying the Method and a Circuit Produced Thereby".

If the analysis tool reveals any errors, the errors must be corrected and the sign-off flow re-started.

Create Logic Test Vectors and Signatures

The fifth step 58 of the sign-off flow comprises creating logic test vectors and signatures and a hard-wired signature module for the logic Test controller. As with step 56, step 58 is performed only if the circuit contains logic test structures. This step is performed using the verification tool. The tool is run to perform the following tasks:

(a) create automatic test pattern generation (ATPG) vectors which are used with a multi-chain scan test configuration;

(b) obtain a reference signature for the logic BIST test mode. The signature is used in a hard-wired signature module that is included within the logic Test controller; and (c) Update the logic Test controller signature module.

Perform Formal Verification

The sixth step 60 of the sign-off flow comprises performing a formal verification of the final circuit description file using an appropriate software tool. This step is performed each time the sign-off flow is performed. Various formal verification tools are commercially available. In general, the tool compares two circuit descriptions to determine whether they are logically equivalent. This is done in a manner that does not require any input patterns and the verification is exhaustive.

If the formal verification tool reveals any errors, the errors must be corrected and the sign-off flow re-started.

Perform Static Timing Analysis

The seventh step 62 of the sign-off flow involves performing a static timing analysis using a timing analysis software tool to check the correctness of the timing of the embedded test structures.

If the timing analysis tool reveals any errors, the errors must be corrected and the sign-off flow re-started.

Create Hand-Off Database

The eighth step 64 of the sign-off flow comprises creating a hand-off database. This step is performed by the verification tool. The hand-off database collects together all intermediate files related to the circuit being signed off. This data structure accompanies the final circuit description file to facilitate reuse of the design as a core, or for use in manufacturing to facilitate testing on automatic testing equipment (ATE) designed to access the hand-off database. The hand-off database is also used as part of the sign-off process to collect together all data about the embedded test added to the design, to ensure the design is complete, consistent, and correct.

In general, the hand-off database is a directory containing a collection of files related to the entire circuit design. During a run to create the database, the verification tool takes a snapshot of all relevant files in the current working directory and creates the database directory. This directory may contain the following:

- descriptions of all test steps that are to be run during manufacturing test;
- descriptions of cores replaced with test-collared versions and the connections of the collared core test points;
- descriptions of the external scan chains of the collared-test core;
- descriptions of the periphery logic of the test-collared cores added to sub-blocks in the design;
- descriptions of all embedded test capabilities in the design;
- descriptions of the physical constraints to enable grouping and port polarity;
- descriptions contained in a boundary scan Description Language (BSDL) file generated during the generation and integration of top-level embedded test capabilities into the design.

Create Top-Level Test Benches

The ninth step 66 of the sign-off flow comprises creating all test benches and simulation scripts for simulation of embedded test structures in the design. The test benches and scripts are created by a software tool, such as the verification tool. Based on the contents of the configuration file, the verification tool performs the following operations:

- creates 1149.1 TAP and boundary scan test benches;
- creates test benches for sub-blocks. Sub-blocks consist of legacy cores, embedded memories, and PLLs that include BIST;
- creates logic BIST test benches;
- creates scan chain test benches.

In general, the generated test benches provide operation codes for the instruction register of the TAP controller. These codes establish the appropriate, user-defined test setup for each different embedded test capability. Using the generated test benches, each of the embedded test capabilities at the gate level are generated in the next step.

Simulate Embedded Test for the Chip

The tenth step 68 of the sign-off flow involves the simulating the embedded test structures in the chip design using the test benches and simulation scripts generated in step 66 and an appropriate simulator. Preferably, in step 66, the verification tool will have generated a template script that contains specific information about the simulator that will be used for simulation of embedded test. For logic test control and scan test, only of a few vectors at the beginning and at the end of the test are normally required to simulate the functionality using a parallel load capability. At least one vector is simulated using serial-load simulation to verify scan shifting. These simulations, together with static timing analysis of the entire chip, is sufficient to validate the correct performance of the logic BIST and scan test.

Steps 56 to 68 constitute a subset 70 of steps which are performed each time the sign-off flow is performed after the first execution of the flow.

Create Test Patterns

The tenth and final step 80 of the sign-off flow comprises creating and formatting manufacturing test patterns. This step is performed by the verification tool. From the Manufacturing configuration file, the verification tool extracts information about which vectors to include and the format to use for the final set of test patterns for manufacturing test. This step is only performed pre-tapeout, once the design has been fully verified and the final layout is complete.

Table 1 summarizes the above described steps for each of a pre-optimization, a post-optimization and a pre-tapeout passes of the sign-off flow.

TABLE 1

Sequence of Steps for Sign-Off Flow

| Step in Sign-Off Flow | Pre-Optimization | Post-Optimization | Pre-Tapeout |
|---|---|---|---|
| Create sign-off netlist (50) | Performed | N/A | N/A |
| Extract/Check netlist (52) | Performed | N/A | N/A |
| Create Input files (54) | Performed | N/A | N/A |
| Create top-level rules (56) | Performed | Performed | Performed |
| Create logic test vectors (58) | Performed | Performed | Performed |
| Formal verification (60) | Performed | Performed | Performed |
| Timing analysis (62) | N/A | Performed | Performed |
| Create hand-off DB (64) | Performed | Performed | Performed |
| Create test benches (66) | Performed | Performed | Performed |
| Simulate embedded test (68) | Performed | Performed | Performed |
| Generate test patterns (80) | N/A | N/A | Performed |

Although the present invention has been described in detail with regard to preferred embodiments and drawings of the invention, it will be apparent to those skilled in the art that various adaptions, modifications and alterations may be accomplished without departing from the spirit and scope of the present invention.

We claim:

1. A circuit sign-off method for use in verifying a circuit design having circuit modules with embedded test circuitry, comprising:

in sequence for each circuit module:
checking connectivity of embedded test circuitry;
creating a verification configuration file;
for a circuit module having logic test circuitry:
checking said circuit module against scan design rules; and
creating associated logic test vectors and signatures;
performing a timing analysis of said circuit module;
creating a hand-off database containing files associated with and describing each test structure embedded in said circuit module;
creating circuit module top-level test benches for validating each mode of operation of each embedded test circuitry using parameters contained in said configuration file;
simulating said embedded test circuitry by executing said test benches on a simulator; and
creating manufacturing test patterns following optimization and layout of said circuit.

2. A method as defined in claim 1, further including performing a formal verification of said circuit its embedded test circuitry prior to said performing a timing analysis of said circuit module.

3. A method as defined in claim 1, further including, creating a sign-off circuit description prior to said checking connectivity of embedded test circuitry.

4. A method as defined in claim 3, said creating a sign-off circuit description includes concatenating descriptions corresponding to all circuit modules, except for circuit modules for which a hand-off database has been created and instantiating circuit modules for which a hand-off database has been created.

5. A method as defined in claim 4, said checking connectivity of embedded test circuitry further includes:
extracting from a circuit module description file, a description of all embedded test circuitry in said circuit module;
creating a test connection map file defining connections between each test circuit embedded in said circuit module and circuit module top-level ports; and
verifying the correctness of said connections.

6. A method as defined in claim 5, said checking connectivity of embedded test circuitry further includes mapping connection rules of embedded test circuitry one level down in design hierarchy to circuit module top-level ports.

7. A method as defined in claim 6, said checking said circuit module against scan design rules further includes creating a simplified model of embedded circuit modules and using a sign-off description of embedded circuit modules.

8. A method as defined in claim 7, said database containing said circuit module test connection map file, said verification configuration file, said simplified model and a test structure information file for each embedded test circuitry in said circuit module.

9. A method as defined in claim 8, said creating a verification configuration file includes inserting into said configuration file, an embedded test circuitry verification section for each embedded test circuit in said circuit module, each said verification section containing parameters for exercising a corresponding test structure in each of its modes of operation.

10. A method as defined in claim 9, said creating circuit top-level test benches includes creating, for each embedded test circuitry verification section of said configuration file, a sequence of commands for exercising, from a top-level of said circuit module, a corresponding embedded test circuit in each of its modes of operation and translating said sequence of commands to test benches.

11. A method as defined in claim 10, said timing analysis being a static timing analysis of said circuit module to verify timing correctness of embedded test circuitry.

12. A method as defined in any one of claims 1–11, further including optimizing said final circuit description and then repeating said method.

13. A method as defined in claim 12, performing a layout of said final circuit description and then repeating said method.

14. A method as defined in any one of claims 5–11, said for each circuit module includes beginning with circuit modules at a lowest level of hierarchy and proceeding in sequence through each level of design hierarchy to a circuit module at a highest level of hierarchy.

15. A method as defined in claim 1, said checking connectivity of embedded test circuitry further includes:
extracting from a circuit module description file, a description of all embedded test circuitry in said circuit module;
creating a test connection map file defining connections between each test circuit embedded in said circuit module and circuit module top-level ports; and
verifying the correctness of said connections.

16. A method as defined in claim 15, said checking connectivity of embedded test circuitry further includes mapping connection rules of embedded test circuitry one level down in design hierarchy to circuit module top-level ports.

17. A method as defined in claim 1, said checking said circuit module against scan design rules further includes creating a simplified model of embedded circuit modules and using a sign-off description of embedded circuit modules.

18. A method as defined in claim 17, said database containing said circuit module test connection map file, said verification configuration file, said simplified model and a test circuit information file for each embedded test circuit in said circuit module.

19. A method as defined in claim 1, said creating a verification configuration file includes inserting into said configuration file, an embedded test circuit verification section for each embedded test circuit in said circuit module, each said verification section containing parameters for exercising a corresponding test circuit in each of its modes of operation.

20. A method as defined in claim 1, said creating circuit top-level test benches includes creating, for each embedded test circuit verification section of said configuration file, a sequence of commands for exercising, from a top-level of said circuit, a corresponding embedded test circuit in each of its modes of operation and translating said sequence of commands to test benches.

21. A method as defined in claim 1 said timing analysis being a static timing analysis of said circuit module to verify timing correctness of embedded test circuitry.

22. A sign-off method for use in verifying embedded test circuitry in a circuit design having circuit modules with embedded test circuitry, said method comprising:
for each circuit module in said design containing embedded test circuitry, repeating the following steps, in sequence, beginning with a circuit module at a lowest level of hierarchy and ending with a circuit module at a highest level of hierarchy of said circuit design:
extracting a description of all embedded test circuitry in said circuit module from a final circuit module description file, creating a test connection map file specifying connections between inputs and outputs of said embedded test circuitry and ports of said circuit module, and verifying the correctness of said connections, including, for signed-off circuit modules, using a test connection map created for said signed-off circuit modules and verifying connections between circuit module ports and ports of said signed-off circuit modules;
creating a verification configuration file containing, for each said embedded test circuit, a specific verification section containing parameters for use in generating a sequence of simulation steps for verifying proper operation of said embedded test circuits in said circuit module;
for a circuit module containing logic test circuitry which has not been signed-off, verifying that each said logic test circuitry complies with logic test structure design rules and creating logic test vectors and a reference signature for each said logic test structure;
performing a formal verification of said circuit modules which have not been signed-off;
performing a static timing analysis of said final circuit module description which have not been signed-off to verify timing correctness of embedded test circuitry;

creating a hand-off database containing all intermediate files related to said embedded test circuitry in said circuit module including said test connection map file, said configuration file, and embedded test circuitry information files;

generating a sign-off simulation test bench for each specific verification section of said configuration file for each said sequence of simulation steps using embedded test circuitry connections specified in said test connection map file;

executing said test benches to simulate all embedded test circuitry in said circuit module; and, following optimization and layout of said circuit, creating manufacturing test patterns.

23. A method as defined in claim 22, said circuit modules include one or more circuit sub-blocks, cores, and/or a top-level block.

\* \* \* \* \*